(12) United States Patent
Hara et al.

(10) Patent No.: US 6,416,831 B1
(45) Date of Patent: *Jul. 9, 2002

(54) EVACUATED PACKAGE AND A METHOD OF PRODUCING THE SAME

(75) Inventors: Tetsuzo Hara, Yokosuka; Yasuhiro Negoro, Yokohama, both of (JP)

(73) Assignee: Murata Manufacturing Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/993,615

(22) Filed: Dec. 18, 1997

(30) Foreign Application Priority Data

Dec. 19, 1996 (JP) ............................................ 8-354588

(51) Int. Cl.$^7$ ............................................ B65D 81/20
(52) U.S. Cl. ...................... 428/34.6; 428/426; 428/428; 428/432; 206/524.8; 220/363; 220/364; 220/501; 220/522; 220/592.27
(58) Field of Search ............................... 428/34.1, 34.4, 428/426, 428, 429, 432, 34.6, 34.7; 206/524.8; 220/501, 254, 592.27, 522, 363, 364

(56) References Cited

U.S. PATENT DOCUMENTS

| | | | | |
|---|---|---|---|---|
| 4,314,225 A | * | 2/1982 | Tominaga et al. | 338/4 |
| 4,861,686 A | * | 8/1989 | Snyder | 429/90 |
| 4,966,039 A | | 10/1990 | Dell'Acqua | 73/727 |
| 4,977,748 A | * | 12/1990 | Diedrich | 62/51.1 |
| 5,335,550 A | * | 8/1994 | Satou | 73/727 |
| 5,417,115 A | * | 5/1995 | Burns | 73/778 |
| 5,498,902 A | * | 3/1996 | Hara | 257/686 |
| 5,533,502 A | | 7/1996 | Piper | 128/203.21 |
| 5,837,562 A | * | 11/1998 | Cho | 438/51 |

FOREIGN PATENT DOCUMENTS

| | | | | |
|---|---|---|---|---|
| EP | 372 108 A1 | * | 5/1988 | ............ 23/44 |
| JP | 57-93225 | * | 6/1982 | |
| WO | WO 87/7947 A1 | * | 12/1987 | |
| WO | WO 8707947 | | 12/1987 | |

OTHER PUBLICATIONS

West Abstract of JP 57–93225A; Mihashi et al.; Vacuum Sealing Method of Vacuum Container For Pressure Transducer, Jun. 10, 1982.*
Merriam Webster's Collegiate Dictionary, 10th Edition, pp. 1117–1118, 1998.*
Patent Abstracts of Japan, vol. 006, No. 175 (P–141), Sep. 9, 1982 & JP 57 093225 (Mitsubishi Electric Corp.), Jun. 10, 1982, abstract.

* cited by examiner

Primary Examiner—Rena L. Dye
(74) Attorney, Agent, or Firm—Ostrolenk, Faber, Gerb & Soffen, LLP

(57) ABSTRACT

An evacuated package with highly reliable vacuum-sealing and a method for producing an evacuated package with the evacuatable package. A lid portion is joined onto a substrate with an element accommodated in an evacuated space formed by the substrate and the lid portion. A connecting hole in the lid portion extends from the space to the top face of the lid portion. A metal film is formed around the complete peripheral region of the opening of the connecting hole, and a thermo-melting material is joined to the metal film to close the opening of the connecting hole so as to seal the element in the evacuated space. Before closing the opening of the connecting hole with the thermo-melting material, the space is evacuated, and simultaneously, the thermo-melting material is melted by heat and left until completely degassed in a vacuum. The degassed thermo-melting material is then pressed and joined to the metal film around the periphery of the opening of the connecting hole to close the opening with the thermo-melting material and vacuum-seal the space.

13 Claims, 3 Drawing Sheets

EVACUATED PACKAGE AND A METHOD OF PRODUCING THE SAME

BACKGROUND OF THE INVENTION

1. Field of the Invention

The present invention relates to an evacuatable package for sealing an element, such as a micromechanical vibratory gyroscope, in an evacuated space, to an evacuated package containing such an element, and to a method for producing such an evacuated package.

More particularly, the present invention relates to an evacuated package comprising a substrate, a lid portion joined onto said substrate, an evacuated space formed by said substrate and said lid portion, an element formed on said substrate and contained in said evacuated space, and a connecting hole connecting said evacuated space with an opening formed on the top face of said lid portion.

2. Description of the Related Art

FIG. 5 shows an example of a package structure for sealing a vibrating element, such as a micromechanical vibratory gyroscope, in an evacuated space. This evacuated package is composed of: a substrate 1 made of silicon, for example; a lid portion 2 to be anode-coupled with the substrate 1; and a vibrating element 4 (e.g., a micromechanical vibratory gyroscope) formed on the substrate 1 and accommodated in a space 3 formed by the substrate 1 and the lid portion 2.

The lid portion 2 has a connecting hole 5 connecting the space 3 to the outside for exhausting excess gas from the space 3 after anodic bonding the substrate 1 and the lid portion 2. The connecting hole 5 is closed with a sealing film 6 formed by sputtering, electron-beam deposition, or the like so as to seal the space 3 to maintain a vacuum.

The vibrating element 4 is a fine element produced by a semiconductor-device fabrication technique and its operational characteristics deteriorate in the atmosphere due to air-dumping. By sealing the vibrating element 4 in the evacuated space 3 maintained under a vacuum as described above, the vibrating element 4 can vibrate without the influence of air-dumping, and thus deterioration in the operational characteristics of the vibrating element 4 caused by air-dumping is prevented.

However, according to the above structure in which the connecting hole 5 is closed with the sealing film 6, a disadvantage is that the vibrating element 4 cannot be reliably vacuum-sealed, a fact which is attributed to the following: Since the connecting hole 5 is made in the lid portion 2 by a piercing technique such as ultrasonic processing or sandblast processing, the inner face of the resulting connecting hole 5 is rough, or in other words, has concave portions and convex portions. Furthermore, with respect to the face to which the connecting hole 5 opens, the inner face of the connecting hole 5 is tapered, as is shown in the figure, or perpendicular (not shown in the figure). Thus, it is difficult to perfectly form the sealing film 6 on the inner face of the connecting hole 5 by sputtering, electron-beam deposition, or the like. In other words, the sealing film 6 is formed on convex portions and not formed on concave portions of the inner face of the connecting hole 5 so that the inner face of the connecting hole 5 cannot be entirely covered with the sealing film 6. Thus, the space 3 is not perfectly sealed by the sealing film 6 and the air-tightness of the space 3 deteriorates, thereby decreasing the reliability of the vacuum-sealing of the vibrating element 4.

SUMMARY OF THE INVENTION

The present invention is aimed at solving the above problems. Accordingly, the present invention is related to an evacuatable package in which an element can be readily sealed in an evacuated space with improved reliability while exhibiting excellent operational characteristics. The invention is further related to an evacuated package containing such an element, and to a method for producing such an evacuated package.

The invention provides an evacuatable package of the above mentioned kind, which is characterized in that a metal film is formed on the top face of said lid portion around the periphery of said opening of said connecting hole, and a thermo-melting material is joined to said metal film to close said opening of said connecting hole.

According to the present invention, the metal film can completely cover the peripheral region of the opening of the corresponding connecting hole which opens at the top face of the corresponding lid portion, because the metal film is formed around the complete peripheral region of the opening of the corresponding connecting hole. Thus, the thermo-melting material and the metal film can be joined without forming spaces therebetween, so the space accommodating an element can reliably be evacuated and sealed to maintain a vacuum by closing the openings of the connecting holes. Thus, it is possible to greatly increase the air-tightness of the space and the element can be vacuum-sealed with greatly improved reliability.

In the above evacuated package, either said substrate or said lid portion may be composed of a glass material and the other may be composed of silicon.

In an evacuated package in which either the substrate or the lid portion is formed of a glass material and the other is composed of silicon, the substrate and the lid portion can be stably joined by anodic bonding. Therefore, the lid portion can be prevented from being stripped off of the substrate, resulting in more reliable element packaging.

The invention also provides a method for producing an evacuated package, comprising the steps of: (1) forming said opening of said connecting hole on the top face of said lid portion and a metal film on the top face of said lid portion around the periphery of said opening of said connecting hole; (2) arranging said lid portion having said connecting hole above said substrate having said element so as to accommodate said element in the space formed by said substrate and said lid portion; (3) joining said substrate to said lid portion; (4) evacuating said space accommodating said element through said connecting hole connecting said space; (5) closing said opening of said connecting hole by joining degassed thermo-melting material to said metal film so as to seal said space accommodating said element to maintain a vacuum.

In a method for producing an evacuated package incorporated in the present invention, the degassed thermo-melting material is pressed to the metal film, formed around the periphery of the opening of a connecting hole, and joined thereto so that the opening the connecting hole is closed and the space accommodating an element is sealed to maintain a vacuum. Therefore, the gas generated from the thermo-melting material is prevented from entering the space through the corresponding connecting hole, and the space is readily sealed to maintain a vacuum in which the element exhibits excellent operational characteristics. The operational characteristics of the element can be thereby improved.

The above method may further comprise the steps of: (1) preparing a second substrate, used for placing said thermo-melting material, having a dent formed in a region corresponding to said opening of said connecting hole; (2)

placing said thermo-melting material in said dent on said second substrate, melting said thermo-melting material by heat, and leaving said thermo-melting material until it is substantially completely degassed, advantageously during the evacuating step; and (3) pressing said second substrate to the top face of said lid portion with said thermo-melting material in said dent and said opening of said connecting hole facing each other in the step of closing said opening of said connecting hole.

In the above method, a second substrate having a dent formed in a region corresponding to the opening of a connecting hole is prepared beforehand, and then, the thermo-melting material is placed in the dent and melted by heat for degassing. With the degassed thermo-melting material in the dent facing the openings of the connecting holes, the second substrate having the thermo-melting material thereon is pressed to the lid portion so that the thermo-melting material is pressed to the metal film around the periphery of the opening of the connecting hole and joined thereto. The positioning of the thermo-melting material at the time of pressing the thermo-melting material to the metal film around the periphery of the opening of a connecting hole thereby becomes easier. As a result, the opening of the connecting hole can be more reliably closed with the thermo-melting material and the element yield can be improved.

In the above method, a plurality of said elements may be simultaneously formed on one initial substrate while a plurality of said lid portions each having a concave portion in a region corresponding to said element may be formed in one initial lid substrate; the initial lid substrate may be joined to said initial substrate such that each element faces the corresponding concave portion and is packaged by said initial substrate and the corresponding lid portion; and said initial substrate and said initial lid substrate may be cut along predetermined dicing lines to make a plurality of said substrates and said lid portions so as to separate and complete the vacuum-sealed elements.

Since a plurality of connecting hole openings can be simultaneously closed with the thermo-melting material, the operational time required for sealing the connecting holes can be reduced and mass-production of the packaging structure becomes possible.

DESCRIPTION OF EMBODIMENTS OF THE INVENTION

The present invention will be better understood from the following description taken in conjunction with the accompanying drawings.

Figure 1A:
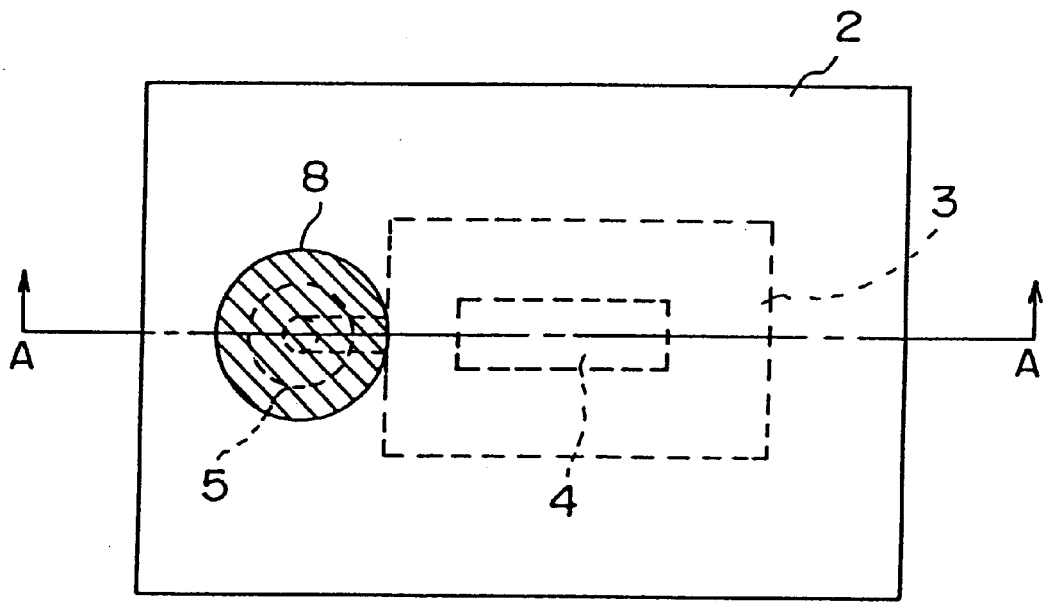
FIG. 1(a) and 1(b) show an evacuated package according to an embodiment of the present invention.
Figure 1B:
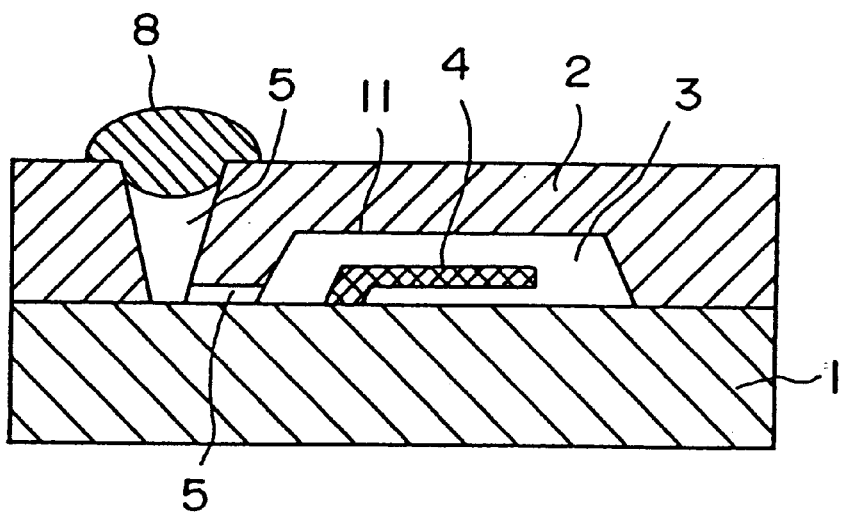

FIG. 1(a) shows a vacuum-sealed element which is obtained by packaging a vibrating element in a package structure according to an embodiment of the present invention, and FIG. 1(b) is a cross-sectional view taken along the line A—A in FIG. 1(a). The numerals in the different views identify substantially identical parts in the above conventional example, and detailed explanations thereof are omitted.

The evacuated package of this embodiment is composed of: a first substrate 1 made of silicon; a lid portion 2; a vibrating element 4 such as a micromechanical vibratory gyroscope; and a thermo-melting material 8 (i.e., material that melts due to heat) such as solder. As is shown in FIGS. 1(a) and 1(b), the vibrating element 4 is formed on the first substrate 1 by a semiconductor-device fabrication technique and the lid portion 2 is anode-coupled with the first substrate 1.

The lid portion 2 has a concave portion 11 in a region corresponding to the vibrating element 4. The vibrating element 4 is accommodated in a space 3 formed by the concave portion 11 and the first substrate 1. The lid portion 2 further has a connecting hole 5 starting from the space 3 and opening to the top face of the lid portion 2.

Figure 2:
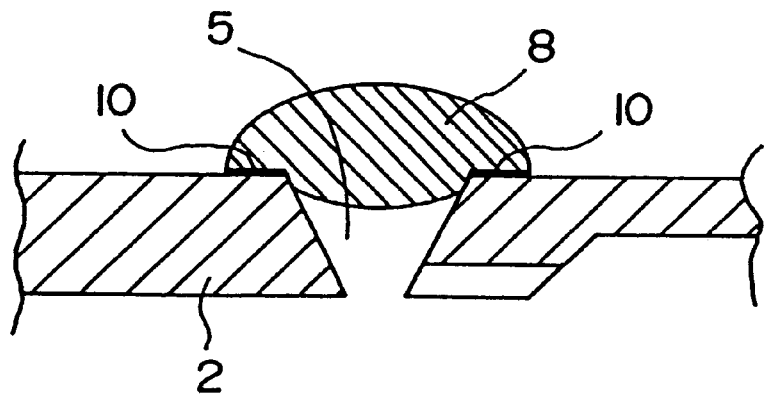
FIG. 2 is an enlarged cross-sectional view of a connecting hole shown in FIGS. 1(a) and 1(b)

As is shown in FIG. 2 which is an enlarged cross-sectional diagram of the connecting hole 5 and its surroundings, a metal film 10 composed of aluminum, gold, or the like is formed on the top face of the lid portion 2 around the periphery of the opening of the connecting hole 5. By joining the thermo-melting material 8 to the [undercoating electrode film]metal film 10, the opening of the connecting hole 5 is closed with the thermo-melting material 8 so that the vibrating element 4 is sealed in the space 3 maintained under a vacuum.

According to the above embodiment, the lid portion 2 is made of a glass substrate, the connecting hole 5 is opened to the top face of the lid portion 2, and the metal film 10 is formed on the top face of the lid portion 2 around the complete peripheral region of the opening of the connecting hole 5 by sputtering, electron-beam deposition, or the like. Thus, the complete peripheral region of the opening of the connecting hole 5 can be perfectly covered with the metal film 10. It is preferred that the top face of the lid portion 2 be flattened by polishing with a polishing technique. The flatter the top face, the more accurately the metal film can be formed.

By joining the metal film 10 to the thermo-melting material 8, spaces formed between the thermo-melting material 8 and the metal film 10 can be prevented, and thus the air-tightness of the space 3 can be improved.

A method for producing vacuum-sealed elements according to the above-described evacuated package will now be explained. In this method, vacuum-sealed elements having the above package structure are produced according to the following processing steps so as to achieve mass-production at high efficiency. A plurality of vibrating elements 4 are simultaneously formed on one silicon first substrate 1, and a plurality of lid portions 2 each having a concave portion 11 in a region corresponding to a vibrating element 4 are formed in one glass substrate. Next, the glass substrate is joined to the silicon first substrate 1 such that each vibrating element 4 faces the corresponding concave portion 11 and is packaged by the first substrate 1 and the corresponding lid portion 2. Then, the silicon first substrate 1 and the glass substrate are cut along predetermined dicing lines so as to separate and complete the vacuum-sealed elements. The production method will be explained in more detail below.

First, the vibrating elements 4 are each formed at a predetermined location on the first substrate 1, which has not yet been cut, by a semiconductor-device fabrication technique. Meanwhile, in the glass substrate which is to be formed into the lid portions, the concave portions 11 are each formed in a region corresponding to a vibrating element 4; through-holes 12, and grooves 13 (each connecting a through-hole 12 with the corresponding concave portion 11) are formed, as is shown in FIG. 3; and the metal films 10 are formed around the complete peripheral regions of the openings of the corresponding through-holes 12 opening to the top face of the corresponding lid portions 2.

Figure 3:
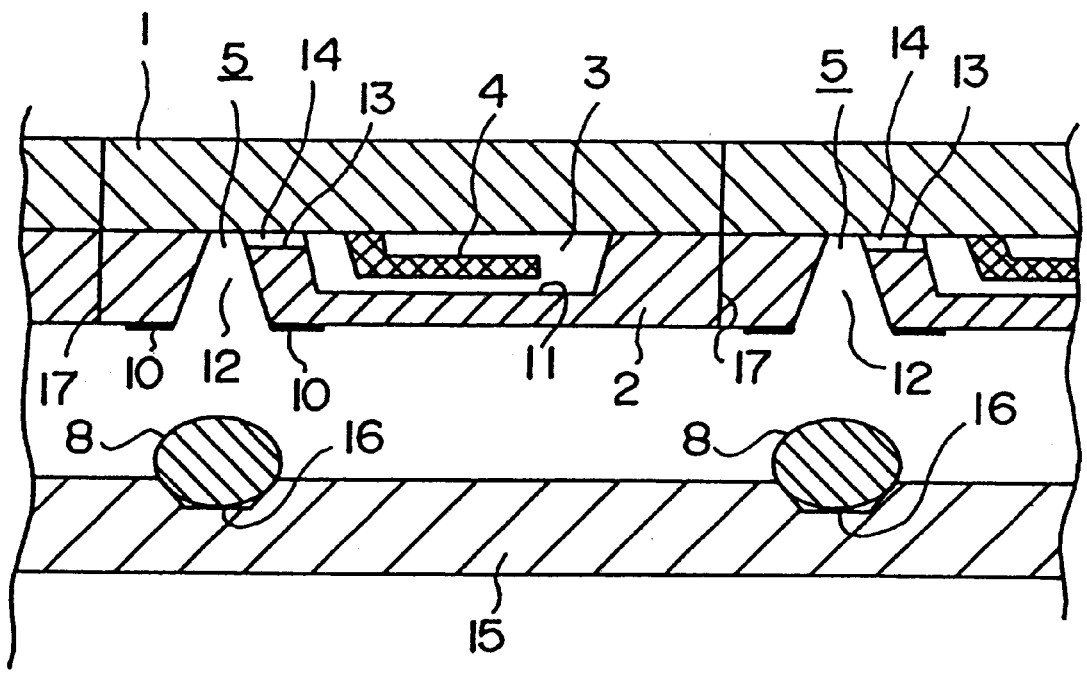
FIG. 3 illustrates a method for producing the evacuated package shown in FIGS. 1(a) and 1(b)

In a vacuum, each of the concave portions 11 of the lid portions 2 faces a corresponding one of the vibrating elements 4 of the first substrate 1 with the lid portions 2 being above the first substrate 1, and then, the contacting portions between the first substrate 1 and the lid portions 2 are joined by anodic bonding to form the spaces 3 each accommodating a vibrating element 4, as shown in FIG. 3. During this processing step, connecting paths 14 each connecting a space 3 with a through-hole 12 are formed by the first substrate 1 and the respective grooves 13 of the respective lid portions 2, and simultaneously, connecting holes 5 are formed by the respective connecting paths 14 and the respective through-holes 12.

The air in the spaces 3 and the gas (e.g., oxygen gas) generated from the joined portions between the substrate 1 and the lid portions 2 by anodic bonding are exhausted from the spaces 3 through the connecting holes 5.

In a vacuum, the thermo-melting material 8 is placed in recesses 16 of a second substrate 15, as is shown in FIG. 3, melted by heat, and then, left as it is until the thermo-melting material 8 is completely degassed. The recesses 16 of the second substrate 15 are each formed at a location corresponding to the opening of a connecting hole 5.

The spaces 3 are evacuated until the vibrating elements 4 exhibit excellent operational characteristics. While continuing evacuation, the thermo-melting material 8 in the recesses 16 and the corresponding openings of the connecting holes 5 are arranged so that they face each other, as is shown in FIG. 3, and then, the second substrate 15 is pressed to the lid portions 2 so as to join the degassed thermo-melting material 8 to the metal films 10 formed around the openings of the connecting holes 5. The openings of the connecting holes 5 are thereby closed with the thermo-melting material 8 and the spaces 3 are vacuum-sealed.

Figure 4:
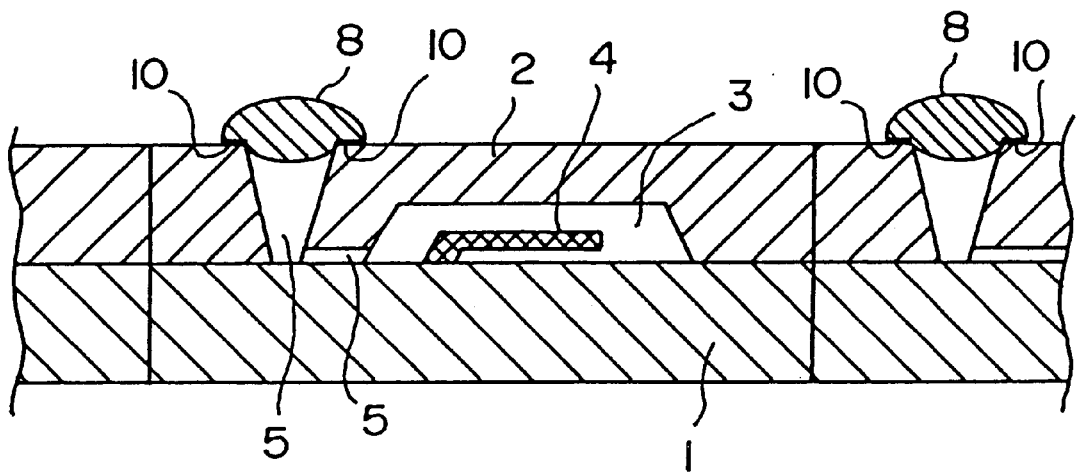
FIG. 4 illustrates another method for producing the evacuated package shown in FIGS. 1(a) and 1(b)
Figure 5:
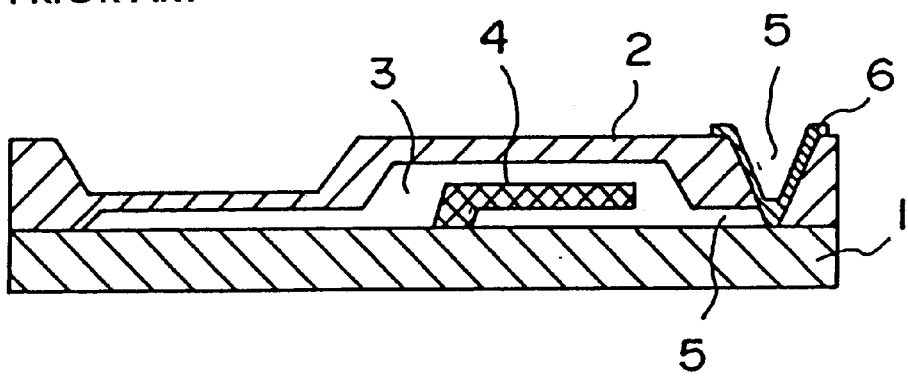
FIG. 5 shows a conventional element package structure.

The thermo-melting material 8 is then cooled to stabilize the joining portions between the thermo-melting material 8 and the metal films 10. For completion of the vacuum-sealed elements, the first substrate 1 and the lid portions 2 are cut along predetermined dicing lines 17, as is shown in FIG. 4, to separate the vacuum-sealed elements.

According to this embodiment, each of the metal films 10 completely covers the peripheral region of the opening of the corresponding connecting hole 5 on the top face of the corresponding lid portion 2. Thus, spaces can be prevented from forming where the thermo-melting material 8 is joined to the metal films 10.

Since the thermo-melting material 8 and the metal films 10 can be joined without forming spaces, as is mentioned above, it is possible to greatly increase the air-tightness of the spaces 3. Thus, the vibrating elements 4 can be vacuum-sealed with greatly improved reliability.

Furthermore, since the thermo-melting material 8 and the metal films 10 are joined by pressing the degassed thermo-melting material 8 towards the metal films 10, no gas generated from the thermo-melting material 8 enters the spaces 3 through the corresponding connecting holes 5. As a result, the spaces 3 are readily sealed to maintain a vacuum in which the vibrating elements 4 have excellent operational characteristics. Vacuum-sealed elements in which the vibrating elements 4 exhibit excellent operational characteristics can thereby be provided.

Moreover, according to this embodiment, the second substrate 15 having recesses 16 each formed in a region corresponding to the opening of a connecting hole 5 is prepared beforehand, and then, using the second substrate 15, the thermo-melting material 8 is joined to the metal films 10 each formed around the periphery of the opening of the corresponding connecting hole 5. Thus, a plurality of openings of the connecting holes 5 can be simultaneously closed with the thermo-melting material 8 by the following simple procedure: the thermo-melting material 8 is placed in the recesses 16 of the second substrate 15 and melted by heat, and then, the second substrate 15 is pressed towards the lid portions 2 with the thermo-melting material 8 and the openings of the connecting holes 5 arranged so that they face each other. As a result, the operational time required for sealing the openings of the connecting holes 5 can be greatly reduced.

Additionally, the openings of the connecting holes 5 can be reliably closed with the thermo-melting material 8 because positioning of the thermo-melting material 8 becomes easier. Therefore, deterioration in the yield of the vacuum-sealed elements due to inferior products, in which the thermo-melting material 8 shifts from the openings of the connecting holes 5 and cannot close the connecting holes 5, can be prevented, resulting in an improved yield.

The present invention is not restricted to the above embodiment and can be applied to various modes. For example, although the first substrate 1 is made of silicon and the lid portions 2 are formed from a glass substrate in the above embodiment, the first substrate 1 may be made of a glass substrate and the lid portions 2 may be formed from a silicon substrate. Furthermore, the first substrate 1 and the lid portions 2 may be made of materials other than silicon and glass, such as semiconductor materials other than silicon and insulating materials other than glass.

Moreover, although in the above embodiment the second substrate 15 is used to close the openings of the connecting holes 5 by pressing and joining the material 8 to the metal films 10, alternatively the openings of the connecting holes 5 may be closed without using the second substrate 15, by placing the degassed thermo-melting material 8 directly on the openings of the connecting holes 5 and then joining the material 8 to the metal films 10, as is shown in FIG. 4.

Furthermore, although the vacuum-sealed vibrating elements 4 are micromechanical vibratory gyroscopes in the above embodiment, the evacuated package of the present invention can be applied for vacuum-sealing other elements such as capacitor elements.

Additionally, although the connecting paths 14 each composing a connecting hole 5 are formed by the grooves 13 of the corresponding lid portions 2 and the first substrate 1 in the above embodiment, such connecting paths may alternatively be formed by forming grooves connecting the through-holes 12 of the corresponding lid portions 2 and the corresponding concave portions 11 on the side of the first substrate 1, and then, anodic bonding the first substrate 1 and the lid portions 12.

Although the present invention has been described in relation to particular embodiments thereof, many other variations and modifications and other uses will become apparent to those skilled in the art. Therefore, the present invention is not limited by the specific disclosure herein.

What is claimed is:

1. An evacuatable package, comprising:

a substrate;

a glass lid coupled to said substrate to form an evacuatable space between the glass lid and the substrate, said lid having an upper surface located externally of said evacuatable space, said upper surface of the lid being disposed above an upper surface of the substrate;

a first opening formed in said lid and extending from said upper surface of said lid toward said substrate;

a second opening formed in said lid and extending from said evacuatable space to said first opening, said first and second openings communicating directly with each other to define a continuous evacuation passage extending from said evacuatable space to said upper surface of the lid, said second opening defining a volume less than a volume of the evacuatable space, the second opening being formed by a gap between the lid and the substrate; and a metal film formed on said upper surface of said lid and encircling around an upper periphery of said first opening, said metal film being adapted for having a thermo-melting material joined thereto so as to close said first opening and thereby seal said evacuatable space.

2. The evacuatable package of claim 1, wherein said substrate upper surface is planar and said lid upper surface is planar.

3. The evacuatable package of claim 1, wherein said first opening is V-shaped and extends to said upper surface of said substrate.

4. The evacuatable package of claim 3, wherein said V-shaped opening has a first end and a second end which is wider than said first end and wherein said first end of said V-shaped first opening is located adjacent said upper surface of said substrate.

5. The evacuatable package of claim 4, wherein said substrate is composed of silicon.

6. The evacuatable package of claim 5, wherein one of said substrate and said lid is composed of an insulating material and the other is composed of a semiconductor material.

7. An evacuatable package, comprising:

a substrate;

a glass lid coupled to said substrate to form an evacuatable space between the glass lid and the substrate in which the air has been at least partially removed to form a partial vacuum, said lid having an upper surface located externally of said evacuatable space, said upper surface of the lid being above an upper surface of the substrate;

an element located on said substrate within said space;

a first opening formed in said lid and extending from said upper surface of said lid toward said substrate;

a second opening formed in said lid and extending from said evacuatable space to said first opening, said first and second openings communicating directly with each other to define a continuous evacuation passage extending from said evacuatable space to said upper surface, said second opening defining a volume less than a volume of the evacuatable space, the second opening being formed by a gap between the lid and the substrate;

a metal film formed on said upper surface and sealed around an upper periphery of said first opening; and a thermo-melting material joined to said metal film so as to close said second opening.

8. The evacuatable package of claim 7, wherein said thermo-melting material is a metallic material.

9. The evacuatable package of claim 7, wherein said substrate upper surface is planar and said lid upper surface is planar.

10. The evacuatable package of claim 7, wherein said first opening is V-shaped and extends to said upper surface of said substrate.

11. The evacuatable package of claim 10, wherein said V-shaped opening has a first end and a second end which is wider than said first end and wherein said first end of said V-shaped first opening is located adjacent said upper surface of said substrate.

12. The evacuatable package of claim 7, wherein said substrate is composed of silicon.

13. The evacuatable package of claim 7, wherein one of said substrate and said lid is composed of an insulating material and the other is composed of a semiconductor material.

* * * * *